(12) United States Patent
Kimura

(10) Patent No.: US 6,353,251 B1
(45) Date of Patent: Mar. 5, 2002

(54) MOS GATE SCHOTTKY TUNNEL TRANSISTOR AND AN INTEGRATED CIRCUIT USING THE SAME

(76) Inventor: Mitsuteru Kimura, 2-56, Shiomidai 3-chome, Shichigahama-machi, Miyagi-gun, Miyagi 985-0821 (JP)

( * ) Notice: Subject to any disclaimer, the term of this patent is extended or adjusted under 35 U.S.C. 154(b) by 0 days.

(21) Appl. No.: 09/198,367

(22) Filed: Nov. 24, 1998

(30) Foreign Application Priority Data

Nov. 28, 1997 (JP) ............................................. 9-328378

(51) Int. Cl.$^7$ ............................................. H01L 27/095
(52) U.S. Cl. ....................... 257/473; 257/471; 257/476; 257/486; 438/570
(58) Field of Search ................................ 257/476, 486, 257/385, 382, 383, 471, 473, 478; 438/171, 570

(56) References Cited

U.S. PATENT DOCUMENTS

| | | | |
|---|---|---|---|
| 4,512,076 A | * | 4/1985 | Mehrotra et al. ............... 29/578 |
| 4,644,386 A | * | 2/1987 | Nishizawa et al. ........ 357/23.3 |
| 5,059,555 A | * | 10/1991 | Iranmanesh et al. ........ 437/192 |
| 5,079,607 A | * | 1/1992 | Sakurai ...................... 357/23.7 |
| 5,109,256 A | * | 4/1992 | De Long ...................... 357/15 |
| 5,177,568 A | * | 1/1993 | Honma et al. ............... 257/295 |
| 5,552,622 A | | 9/1996 | Kimura |
| 6,093,951 A | * | 7/2000 | Burr ........................... 257/408 |

FOREIGN PATENT DOCUMENTS

| | | | | |
|---|---|---|---|---|
| EP | 0 545 381 A2 | * | 6/1993 | .................... 29/72 |
| JP | 9-223795 | | 8/1997 | |

* cited by examiner

Primary Examiner—Steven Loke
Assistant Examiner—Douglas W. Owens
(74) Attorney, Agent, or Firm—McDermott, Will & Emery

(57) ABSTRACT

On a Schottky tunnel junction with Schottky metal as a source, an extremely thin and a high density impurities semiconductor layer having a conduction type different from that of a high density impurities semiconductor constituting the base junction is formed, and height and width of this extremely thin high density impurities semiconductor layer are controlled by adjusting a voltage loaded to a MOS gate formed on this tunnel junction section, so that a main portion of the drain current comprises a carrier passing through the barrier because of the tunnel effect and a carrier moving over this barrier. In addition, a CMOS structure is made to prepare a three-dimensionally or three-dimensionally integrated circuit.

16 Claims, 8 Drawing Sheets

FIG. 5A1
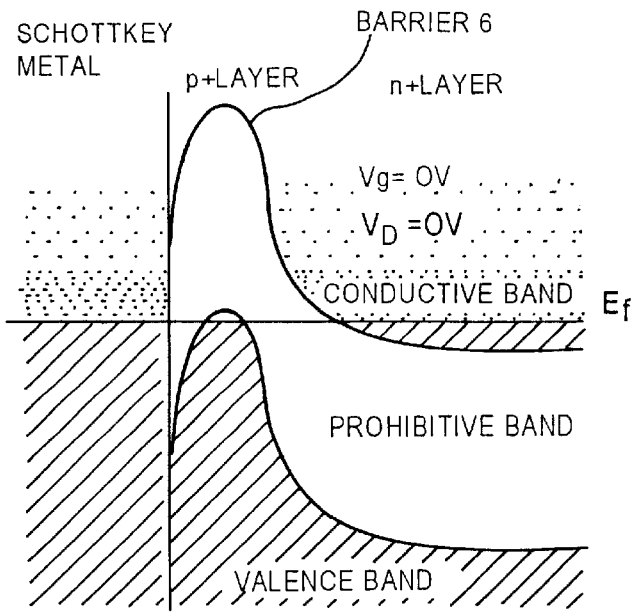
FIG. 5A2
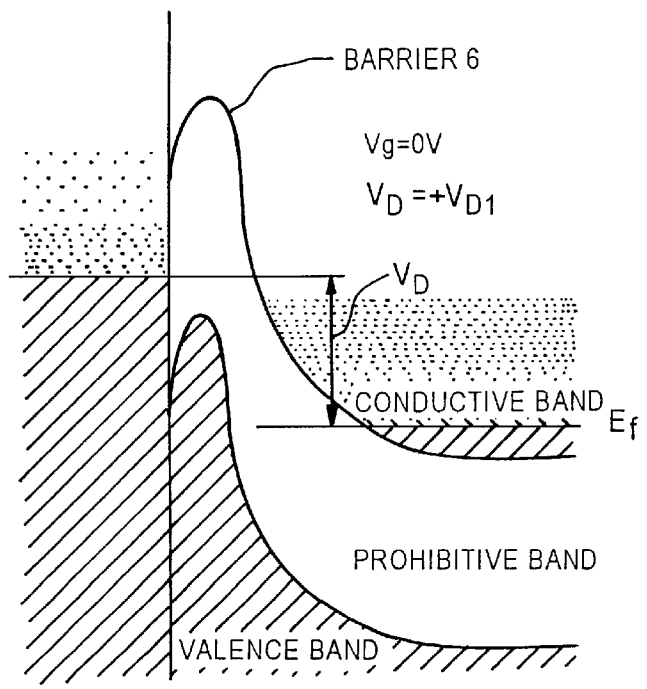

FIG. 5B1
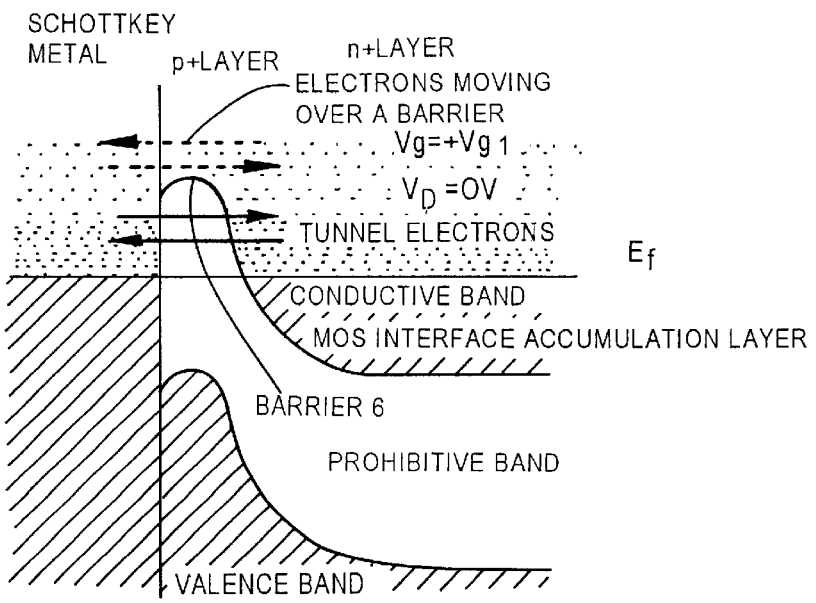
FIG. 5B2
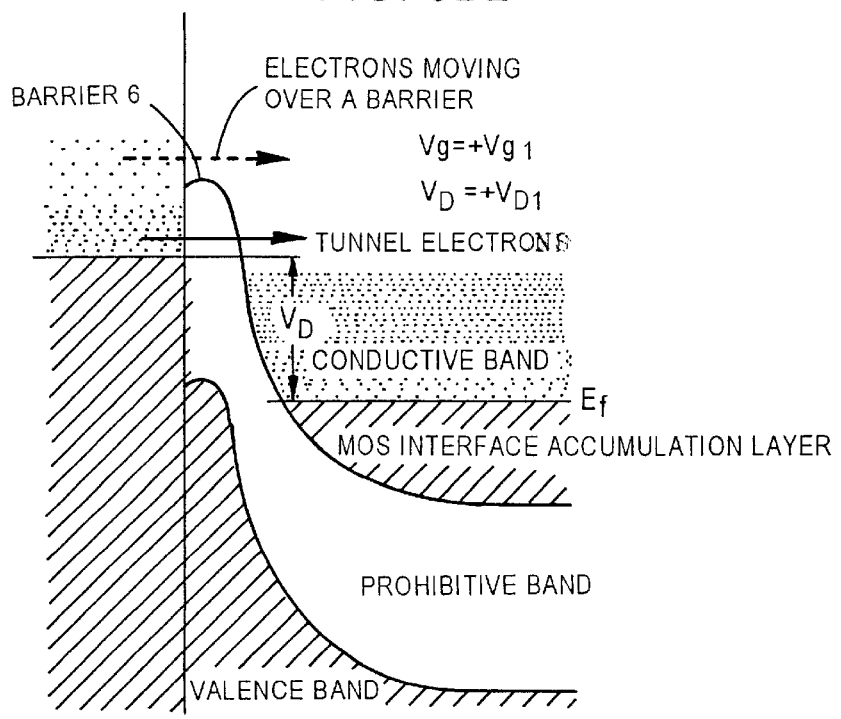

MOS GATE SCHOTTKY TUNNEL TRANSISTOR AND AN INTEGRATED CIRCUIT USING THE SAME

FIELD OF THE INVENTION

The present invention relates to an extremely compact, high speed, and high impedance MOS transistor which can be used, for instance, as a high density and high speed switching circuit in a ULSI, SRAM or DRAM.

In the production of switching transistors, how a compact and high speed switching transistor with a low power consumption can be made is one of the most important challenges. In a MOS type FET, the gate length determines the processing speed. How to control the channel resistance and a gate capacity is a challenge in the technological field. On the other hand, when the gate length is extremely short, the so-called short channel effect occurs in which a depletion layer spans out from the drain and gets integrated with a depletion layer in the source side and causes punch-through. Therefore, it has been extremely difficult to shorten the gate length to 0.1 μm or less.

Conventionally various efforts to mitigate the short channel effect have been made. One such design is disclosed in U.S. Pat. No. 4,644,386 wherein a double drain structure or LDD structure on a MIS (MOS) type FET is formed by forming an insulating thin oxide film on a semiconductor surface between a source S and a drain D and forming a gate metal G thereover to further shorten the insulating gate length. However, the channel area has higher resistivity (low density of impurities) and still exhibits problems caused by the short channel effect.

In U.S. Pat. No. 5,177,568, a tunnel transistor has been proposed having a structure similar to that of the MOSFET in which the source and drain are made from metal, the drain is used as an ohmic electrode, a Schottky junction between the source and the semiconductor is used as a tunnel junction, and a tunnel current is controlled by adjusting a MOS gate voltage.

However, the channel area of this structure still exhibits high resistivity (low density of impurities) and the channel area cannot be set in a low resistance state unless a voltage is applied to the MOS gate metal. Because of this, carrier tunneling rarely occurs through the Schottky junction, the threshold voltage is large, the drain area is required to overlap the gate metal, or height of a barrier of the Schottky junction does not change much upon applying a voltage to the MOS gate. Hence, the mutual conductance (Gm) does not become substantially large.

In U.S. Pat. No. 5,552,622, the present applicant invented a tunnel transistor in which a MOS gate is attached to a junction section of a Schottky junction tunnel diode. However, only a barrier of the Schottky junction was used, so that it is difficult to obtain large mutual conductance (Gm). In Japanese Patent Laid-open Publication No. HEI 9-223795), the present applicant also invented a MOS gate Schottky barrier transistor based on a structure in which height of a barrier of the Schottky junction can be effectively changed according to a voltage applied to the MOS gate not only by using a barrier of the Schottky junction, but also by using a high resistivity material for the Schottky metal 7, or by forming a denatured layer on the Schottky junction interface.

With the above invention, emphasis is especially put on the treatment of a carrier flowing over a barrier of the Schottky junction such that a relatively large mutual conductance (Gm) can be realized. However, the disadvantage is that when the transistor is used as a switching transistor and is turned ON, the resistance is higher, and it is difficult to pass a large current at a high speed through the transistor.

SUMMARY OF THE INVENTION

It is an object of the present invention to provide a high efficiency switching transistor which is substantially free from the short channel effect, has a simple construction which can be formed into an extremely small size, has a high processing speed as well as high input impedance, has a low power consumption and has a high mutual conductance (Gm) when turned ON and can also be integrated into a high density integrated circuit.

To achieve the object described above, the MOS gate Schottky tunnel transistor according to the present invention is obtained by making use of the fact that, in the MOS gate Schottky tunnel transistor based on a construction shown in FIG. 1 in which the gate metal 3 is provided via an insulating thin film on the Schottky junction having the Schottky metal 7 as the source 2, when a surface area of a first semiconductor layer 8 having, for instance, n-type impurities added, a tunnel junction 5 is formed between the Schottky metal 7 and the first semiconductor layer 8. As a result, the tunnel conductance becomes very large. However, when an extremely thin p-type high density impurities layer, second semiconductor layer 9 is formed between the Schottky metal 7 and the first semiconductor layer 8, a barrier 6 against a tunnel junction, as illustrated in FIG. 5A1, is formed between the Schottky metal 7 and the first semiconductor layer 8. As a result, the tunneling of a carrier current hardly occurs because the current flowing between the source 2 and drain 4 (drain current) becomes very small. In the MOS gate Schottky tunnel transistor according to the present invention, when the height of the barrier 6 against a tunnel junction by second semiconductor layer 9 is lowered by applying a gate voltage, a carrier current comprising a tunnel current passing through the tunnel and a carrier current flowing over barrier 6 (seemingly a hysteric current) is obtained, so that a large drain current can be obtained. Because of this feature, the transistors can be formed into an integrated circuit.

The MOS gate Schottky transistor of this invention can also be regarded as a MOS gate Schottky barrier transistor in which the denatured layer is thin enough for electrons to pass therethrough. The gate metal 3 is provided via an insulating thin film on the Schottky junction. By forming such a denatured layer near a Schottky junction section at least just below the MOS gate, the voltage in the Schottky barrier near the MOS interface can be lowered and a carrier current can move over the Schottky barrier when a voltage is applied to the gate to form a high density carrier accumulation layer in both the Schottky metal just below the MOS gate and the semiconductor portion. A main portion of the current passing through the Schottky junction comprises a carrier current moving over the Schottky barrier according to claim 4 in Japanese patent Laid-open Publication No. HEI 9-223795 filed by this applicant.

A more detailed description of the invention is set forth below. Since in the ordinary Schottky junction, the electric resistance of the Schottky metal 7 is small when a substantial zero bias or a reverse-directional bias is applied to the Schottky junction. Even if a voltage is applied to the Schottky junction, a voltage drop hardly occurs in the side of Schottky metal 7, so that height of the Schottky barrier hardly changes.

Thus, even if a gate voltage is loaded, a change of height of the Schottky barrier cannot be controlled, and the height of the thickness of the Schottky barrier is kept large. Only when the thickness of the Schottky barrier is changed, so that a flow of a carrier current flowing over the Schottky barrier which is thermally excited (a diffusion current) is quite small, can a very small tunnel current with small tunneling probability be obtained. Therefore, it is extremely difficult to make a MOS gate Schottky barrier transistor having a large mutual conductance.

However, with the MOS gate Schottky tunnel transistor according to the present invention, a p-type high density impurities layer (second semiconductor layer 9) is formed near the Schottky junction at least just below the MOS gate such that when a positive voltage is applied to the gate metal 3 to form a further higher density carrier accumulation layer in the semiconductor layer (first semiconductor layer 8), the height of the barrier 6 of the MOS interface on the thin p-type high density impurities layer (second semiconductor layer 9) near the Schottky junction interface becomes lower and also the thickness becomes smaller. Hence, a quantity of a current obtained by summing a carrier passing through the barrier 6 (in this case, electrons and a tunnel carrier also including thermal field emission) and a carrier flowing over the barrier 6 (also in this case, electrons) is substantially increased. Therefore, a MOS gate Schottky tunnel transistor providing large mutual conductance (Gm) can be obtained.

Other objects and features of this invention will become apparent from the following description with reference to the accompanying drawings.

BRIEF DESCRIPTION OF THE DRAWINGS

FIG. 5A1 and FIG. 5A2 are views showing an energy band near the MOS interface to illustrate the operation of the MOS gate Schottky tunnel transistor according to the present invention and particularly to show an energy band when the gate voltage Vg is 0 V.

FIG. 5B1 and FIG. 5B2 are views showing an energy band near the MOS interface to illustrate the operation of the MOS gate Schottky tunnel transistor according to the present invention and particularly to show an energy band when a positive voltage Vg=+Vg 1 is applied as the gate voltage Vg.

FIG. 6A is a general flat view, while FIG. 6B is a general cross-sectional view along the line X—X shown in FIG. 6A and FIG. 6C is an enlarged view showing a section near the MOS interface.

DESCRIPTION OF THE PREFERRED EMBODIMENTS

The following is a detailed description for preferred embodiments of a MOS gate Schottky tunnel transistor according to the present invention as well as of an integrated circuit using the same with reference to the related drawings.

Figure 1:
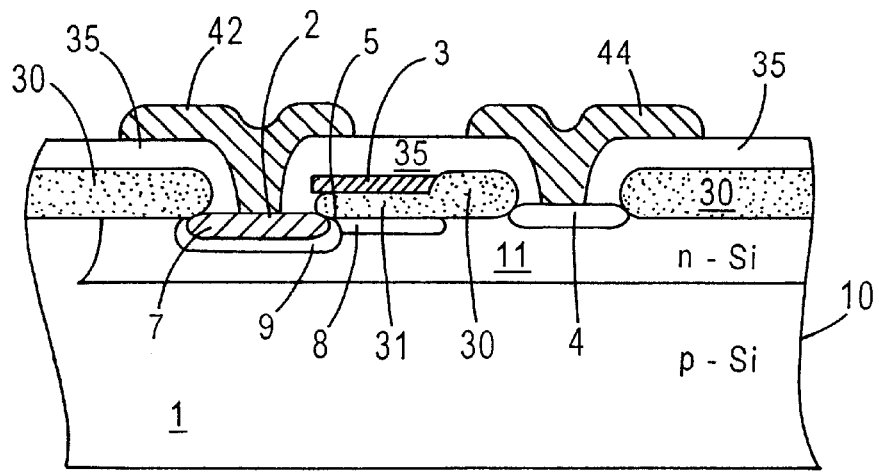
FIG. 1 is a view showing a cross-section of a MOS gate Schottky tunnel transistor according to one embodiment of the present invention embodied as a n-type channel, one in which a drain 4 is separated from a first semiconductor layer 8.

FIG. 1 is a cross-sectional view showing one embodiment of the MOS gate Schottky tunnel transistor according to the present invention and shows one of MOS gate Schottky tunnel transistors sharing the same drain formed by using a substrate 10 with some units of n-well formed on a p-type substrate 1 on one of the n-wells.

In this embodiment, a n-well having a thickness of 3 $\mu$m and the n-type impurity density of about $1 \times 10^{16}$ cm$^{-3}$ is formed on a p-type silicon (Si) monolithic substrate 1 in the direction of (111). A MOS gate Schottky tunnel transistor is produced such that both an independent drain 4 and a first semiconductor layer 8 have the n-type impurities density of about $2 \times 10^{18}$ cm$^{-3}$.

The MOS gate Schottky tunnel transistor according to this embodiment is formed, for example, as follows. A substrate 10 with a n-well 11 is formed on a 10 $\Omega$cm of p-type substrate 1 by insulating and separating a 2 $\mu$m thick epitaxial layer having about $1 \times 10^{16}$ cm$^{-3}$ of n-type impurities density formed through diffusion of p-type impurities. Then, a first semiconductor layer 8 having a surface density of about $2 \times 10^{18}$ cm$^{-3}$ is formed as an n-type semiconductor layer with high-density impurities added therein on a surface area of a semiconductor portion of the substrate just below a MOS gate by means of ion implantation to a depth of about 0.2 $\mu$m. Simultaneously, a drain 4 as an n+ area for ohmic contact between the drain electrode 44 and the n-well 11 is formed.

A thick field oxide film 30 of $SiO_2$ having a thickness of about 0.2 $\mu$m is formed by thermal oxidation on the surface of the substrate 10. Then, a thin gate oxide film 31 comprising $SiO_2$ having a thickness of about 0.02 $\mu$m is formed by thermal oxidation on a window of $SiO_2$ film 30. A molybdenum silicide ($MoSi_2$) thin film (gate metal 3) having a thickness of about 0.1 $\mu$m is formed so that at least a portion of the thin film is superimposed on the first semiconductor layer 8 just below the MOS gate. The $SiO_2$ film 31 is penetrated from the top of the MoSi$_2$ thin film by means of dry etching to obtain a self-align gate. A window is opened so that at least a portion of the surface of the n-well 11 is exposed.

A Schottky metal layer 7 comprising cobalt silicide (CoSi$_2$) as well as a source 2 is formed as follows. A layer of cobalt (Co) is sputtered onto the surface of n-well 11 to a thickness of 0.2 μm and then subjected to thermal processing at a temperature of 550° C. to form cobalt silicide. Any unreacted Co is removed with a phosphoric acid-base etchant. Then aluminum (Al) is sputtered to a thickness of about 0.4 μm. The sputtered aluminum is subjected to thermal processing for 20 minutes at a temperature of 480° C. The thickness of the aluminum and the temperature for the thermal processing at that point of time are important because they affect the properties of a tunnel transistor. When the sputtered aluminum is subjected to a thermal processing at a temperature of about 480° C., aluminum passes through CoSi$_2$ by solid phase diffusion and reaches the Si substrate of the Schottky junction interface to be alloyed with silicon.

Upon cooling, aluminum is left as a high-density impurity in a re-crystallized layer with silicon to form an extremely thin p+ layer having a high-density of impurities (second semiconductor layer 9). The density of the impurities of the p+ layer at this point of time is determined by solid solubility at the thermal processing temperature. The atom weight of silicon that can enter aluminum at this temperature is 0.70 wt. % (see G. J. van Gurp, *J Appl. Phys.*, vol. 50, p. 6923 (1979)). Hence, it can be anticipated no more than about 3 nm of silicon resultantly enters the 0.4 μm thick aluminum film.

Because of this characteristic, the thickness of the extremely thin p+ layer is also about 3 nm, even if all of the aluminum reacts with silicon. The density of aluminum impurity atom in p+ layer is about 5×10$^{18}$ cm$^{-3}$. The important factor here is to control of the thickness and density of such an extremely thin p+ layer by controlling the thickness of aluminum as well as the thermal processing temperature to form the alloy. However, it is not necessary to use aluminum. Aluminum may be replaced with, for example, an alloy of tin and gallium.

Any unreacted aluminum is removed by etching. With those processes described above, the basic MOS gate Schottky tunnel transistor element according to the present invention is completed, but excludes the wiring of passivation film 35; a source electrode 42, and a drain electrode 44, each using the aluminum film, and other elements and processes thereafter conventionally used for an LSI manufacturing process.

With the processes described above, cobalt silicide (CoSi$_2$) as the Schottky metal 7 and source 2 (there is a report that the cobalt alloy formed may be Co$_2$Al$_9$ because Al is more or less alloyed) enters from the edge of the gate metal 3 by about 0.03 μm just below the gate oxide film 31 as a result of the thermal processing step to form the cobalt silicide. The cobalt silicide overlaps with gate metal 3, so that the tunnel junction section receives serious influence by the electric field of the gate metal 3.

A tunnel junction 5 is formed at a distance of about 0.03 μm from an edge of the gate metal 3. This distance is controlled by controlling the thickness of the Co metal layer deposited to form Schottky metal 7 and source 2. Namely, when the Co metal layer and the Si substrate 10 are alloyed to form CoSi$_2$, assuming that all the elements react with each other, a Co atom and a Si atom are alloyed in proportions of 1:2. Therefore, the resulting alloy is embedded into the Si substrate 10. However, it is estimated that dissolution of the Si atoms is slightly less on the oxide film interface, and that a thickness of about 0.03 μm is embedded in the interface just below the gate oxide film when the Co metal layer is deposited to a thickness of 0.02 μm.

In general, dimensional precision in the lateral direction due to photolithography requires extremely high technology and facilities. However, high precision for controlling a film thickness can be obtained with simple technology. Therefore, it is comparatively easier to precisely control embedding dimensions into the interface just below the gate oxide film as described above. An extremely thin p+ layer with high-density impurities (second semiconductor layer 9) having a thickness of about 3 nm thick with density of about 5×10$^{18}$ cm$^{-3}$ is formed between the Schottky metal 7 and the n-well 11 in the lower section of the Schottky metal 7, and between the Schottky metal 7 and the first semiconductor layer 8 just below the MOS gate.

Accordingly, if the p+ layer does not exist, extremely narrow Schottky tunnel junction 5 is formed between the Schottky metal 7 and the first semiconductor layer 8 with high-density impurities of which n-type surface density is about 2×10$^{18}$ cm$^{-3}$. Therefore, the ohmic contact will substantially occur between the Schottky metal and the first semiconductor layer due to the tunnel effect of electrons as carriers.

However, the p+ layer becomes a barrier 6 that prevents the tunnel transmission of electrons as carriers, so that a drain current hardly flows near the place between the source 2 and the drain 4 where a drain voltage is zero unless the barrier 6 of the second semiconductor layer 9 is lowered by applying a voltage to the gate metal 3. A depletion layer is formed between the junction of the second semiconductor layer 9 and the Schottky metal and the junction of the second semiconductor layer 9 and the first semiconductor layer 8.

Figure 2:
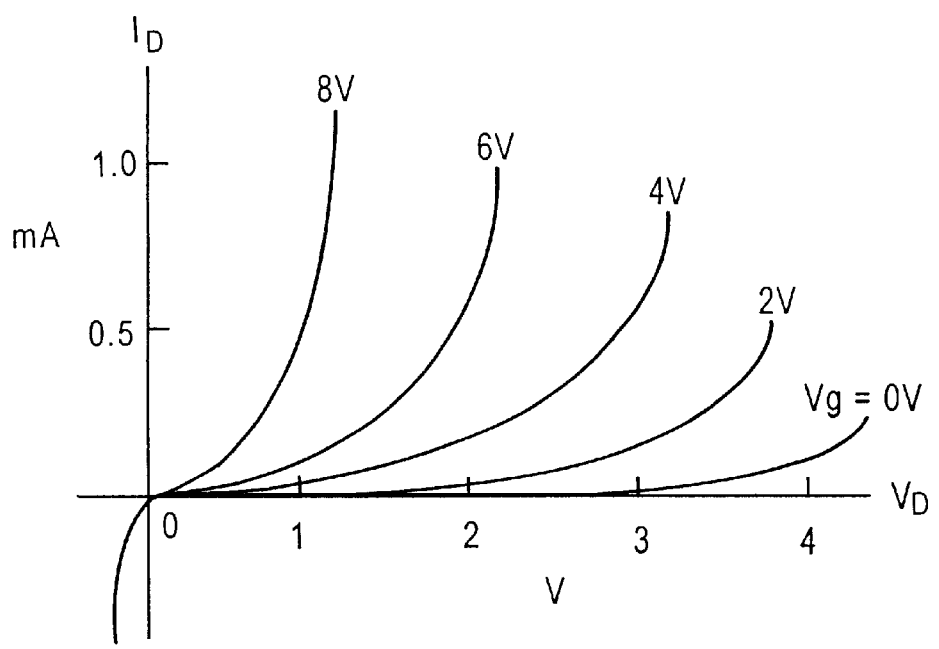
FIG. 2 is a view showing one example of plot of a drain current In verses a gate voltage Vg which uses the drain voltage Vn as a parameter in the MOS gate Schottky tunnel transistor according to the present invention.

FIG. 2 shows properties of a drain voltage $V_D$ versus a drain current $I_D$ by applying a supply voltage $V_{DD}$ to the source electrode 42 as well as to the drain electrode 44 of an ground potential through a load resistance RL so that the Schottky metal 7 having the thin p+ layer of the MOS gate Schottky tunnel transistor inserted therein as described above and a diode comprising the first semiconductor layer 8 as the n+ layer are biased in the reverse direction. The gate voltage $V_g$ is set as a parameter for the gate electrode so that the gate electrode is a positive voltage to the source electrode 42.

As described above, it is clear from FIG. 2 that even when the Schottky metal 7 as the source 2 is set to an ground potential and a voltage of 2V is applied as a positive drain voltage to the drain 4, the drain current $I_D$ hardly flows when the gate voltage Vg is 0 V. However, when a gate voltage Vg such as +2V or +4V is applied, the drain current $I_D$ rises abruptly although the drain voltage $V_D$ is the same 2V.

The feature described above is due to the fact that the drain current increases because the barrier 6 of the p+ layer as the second semiconductor layer 9 is lowered near the MOS gate interface due to applying a positive gate voltage Vg, a current due to electrons as carriers passing the barrier 6 of the p+ layer from the source 2 through the tunnel as well as electrons as carriers moving to the first semiconductor layer 8 over the barrier 6 with thermal processing. Needless to say, the first semiconductor layer 8 and the drain 4 have ohmic properties through the n-well 11 with the same n-type impurities.

Although it has been assumed that the MOS gate Schottky tunnel transistor has n-well 11 where the drain 4 comprises an n-type epitaxial layer formed on the p-type substrate 1, impurities may be diffused instead of forming the epitaxial layer to form the n-well 11. In addition, the n-type substrate 1 may be used if the n-well 11 corresponds to the whole substrate 1, although not shown in the figure, to form the drain 4 on the substrate. In this case, the drain 4 may be formed on any portion of the n-type substrate 1, and may be formed, for instance, on the rear surface of the n-type substrate 1. In this case, by making the area of drain 4 larger on the rear surface of the n-type substrate and forming a large number of sources 2 on the surface of the substrate, a MOS gate Schottky tunnel transistor may be formed for large amounts of electrical power. Furthermore, if the p-type substrate 1 is left as it is, it may be constructed as a thyristor like a conventional type of MOSFET substrate electrode by mounting a p-type ohmic electrode on the p-type substrate 1, further forming an n-type layer on the p-type substrate 1 by being subjected to thermal diffusion or the like, and taking out an electrode from the n-type layer. Each electrode may be formed in each layer by using the substrate 10 having many semiconductor layers, each having a different conductivity type.

Figure 3:
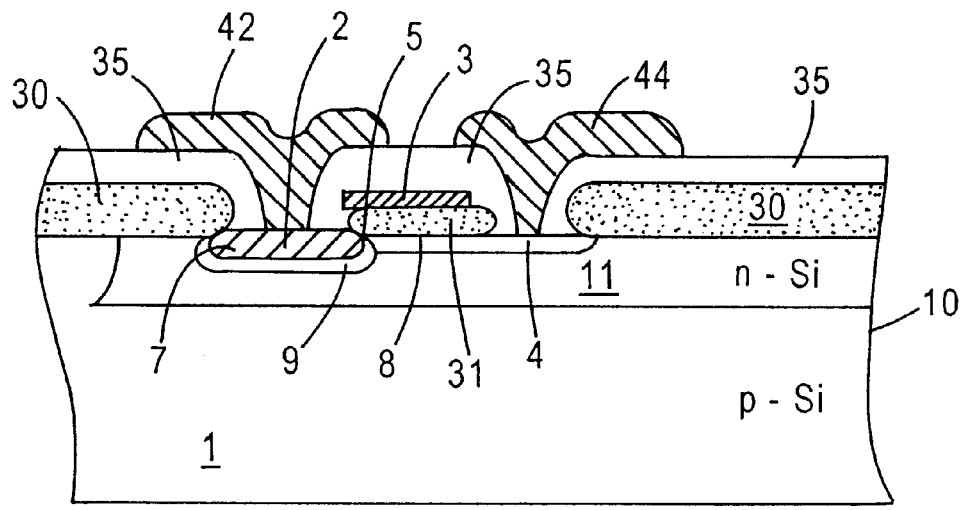
FIG. 3 is a view showing the MOS gate Schottky tunnel transistor according to an another embodiment of the present invention embodied as a n-channel type, one in which the drain 4 and the first semiconductor layer 8 are integrated with each other.

Although the embodiment in FIG. 1 shows an example of the case where the first semiconductor layer 8 and the drain 4 are separated from each other, the first semiconductor layer 8 and the drain 4 may be formed so that they are integrated like that of the embodiment in FIG. 3.

Figure 4:
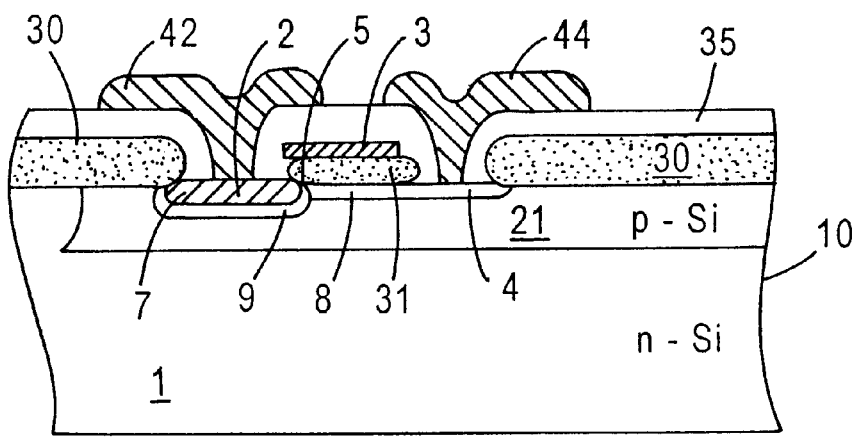
FIG. 4 is a view showing the MOS gate Schottky tunnel transistor according to still another embodiment of the present invention.

The embodiments in FIG. 1 and FIG. 3 show the case where the substrate 10 with n-well 11 consisting of a n-type epitaxial layer formed on the p-type substrate 1 is used, but conversely, a p-well 21 may be formed on a n-type substrate 1 as shown in the embodiment of FIG. 4, and the source 2, gate metal 3 and drain 4 may be formed on the p-well 21. In this case, when many MOS gate Schottky tunnel transistor elements are to be formed in one p-well 21, an integrated circuit with the source 2 shared therewith can be more easily produced.

In accordance with the processes of producing an MOS gate Schottky tunnel transistor of the present invention, cobalt silicide as the Schottky metal 7 is first formed and then an aluminum film (Al film) is deposited thereon. The resultant composite layer is subjected to thermal processing, and the cobalt silicide is diffused or alloyed thereby to reach the interface between the cobalt silicide and Si, and an alloy reaction between Al and Si is generated therein. During the subsequent cooling step, a re-crystallized layer is formed of Si where Al is left as high-density impurities to provide an extremely thin p+ layer (second semiconductor layer 9).

Conversely, a MOS gate Schottky tunnel transistor may be produced by alloying an Al film to be formed so that an extremely thin p+ layer contacts the first semiconductor layer 8 at least below the gate oxide film, removing the unreacted Al, depositing a cobalt silicide thin film thereon by means of CVD or the like to produce Schottky metal 7, and forming an extremely thin p+ layer (second semiconductor layer 9) between the Schottky metal 7 and the first semiconductor layer 8.

A description of the operational principles of the MOS gate Schottky tunnel transistor according to the present invention is illustrated in FIG. 5A1, FIG. 5A2, FIG. 5B1 and FIG. 5B2, which are views showing energy bands.

FIG. 5A1 and FIG. 5A2 are views showing energy bands near the MOS interface just below the MOS gate among the Schottky metal 7 as the source 2, the p+ layer as the second semiconductor layer 9, and the n+ layer as the first semiconductor layer 8 when a gate voltage Vg of the MOS gate Schottky tunnel transistor according to the present invention is 0V. FIG. 5A1 further shows a case where the drain voltage $V_D$ is 0V. FIG. 5A2 shows a case where $V_D=+V_D1$(e.g., $+V_D1=2V$).

FIG. 5B1 and FIG. 5B2 are views showing energy bands like that in FIGS. 5A1 and 5A2 when the gate voltage Vg as a positive voltage Vg=+Vg 1(e.g., Vg 1=2V) is applied to source 2. FIG. 5B1 further shows a case where the drain voltage $V_D$ is 0V. FIG. 5B2 shows a case where $V_D=+V_D1$ (e.g., $+V_D1=2V$).

As shown in FIG. 5A1 and FIG. 5A2, when the gate voltage Vg is 0V, the probability of tunneling of electrons between the Schottky metal 7 and the n+ layer (first semiconductor layer 8) is extremely small because the p+ layer (second semiconductor layer 9) forms a high barrier 6 to electrons. For example, only an extremely small drain current $I_D$ such as pA of the order of $1 \times 10^{-12}$ amperes flows therebetween. However, when the drain voltage $V_D$ is made larger even if the gate voltage Vg is 0V, as shown in FIG. 5A2, the barrier 6 of the p+ layer starts lowering, therefore, when $V_D=5V$, for example, the drain current $I_D$ also becomes an amount in a range from about $\mu A$ to mA has a magnitude that varies in a range from about $1 \times 10^{-6}$ to $1 \times 10^{-3}$ amperes.

As shown in FIG. 5B1 and FIG. 5B2, when the gate voltage Vg is, for example, +2 V, the high barrier 6 of the p+ layer as the second semiconductor layer 9 to electrons lowers due to the field effect of the gate, and a conductive band of the n+ layer (first semiconductor layer 8) forms a storage layer on the MOS gate interface, so that degeneracy is stronger and the width of the barrier 6 of the p+ layer is narrow. Therefore, the probability of tunneling of electrons between the Schottky metal 7 and the n+ layer becomes extremely large and electrons as carriers thermally excited at about room temperature can move over the barrier 6 of the p+ layer.

As described above, when the drain voltage $V_D$ is 0V as shown in FIG. 5B1, the movement of electrons as carriers in two opposite directions is cancelled out, so that the drain current $I_D$ does not flow. But when $V_D$ is 2V, for example, a large drain current $I_D$ due to electrons as the tunnel elements as well as the thermal excitation elements moving over the barrier 6 can be observed.

It should be noted that tunnel electrons are considered to have not only the electrons near Fermi energy Ef unless the temperature thereof is extremely low as liquid nitrogen with a temperature of 77° K, but also have a large amount of current electrons thermally excited that tunnel a portion of an energy area of the barrier slightly lower from the top of the barrier 6 of the p+ layer, namely due to thermal field emission (TFE).

Figure 6A:
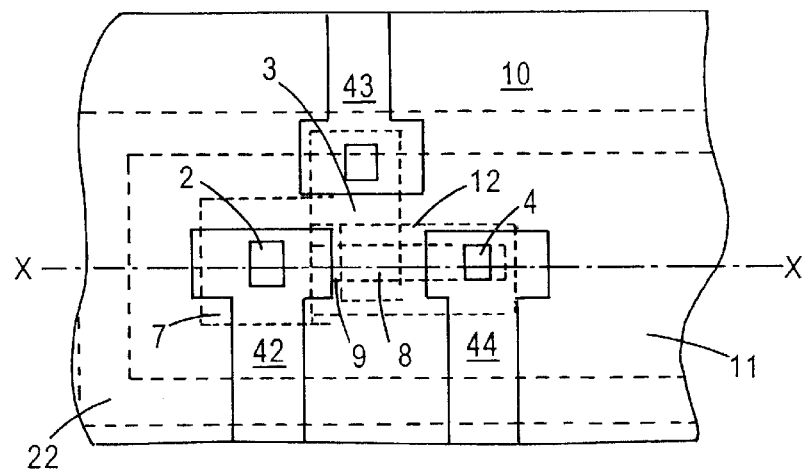
FIGS. 6A to 6C are views showing the MOS gate Schottky tunnel transistor according to still another embodiment of the present invention in which the second semiconductor layer 9 is surrounded by Schottky metal 7, a n-type area 12 and the first semiconductor layer 8 so that the MOS gate Schottky tunnel transistors can easily be insulated against and separated from each other.
Figure 6B:
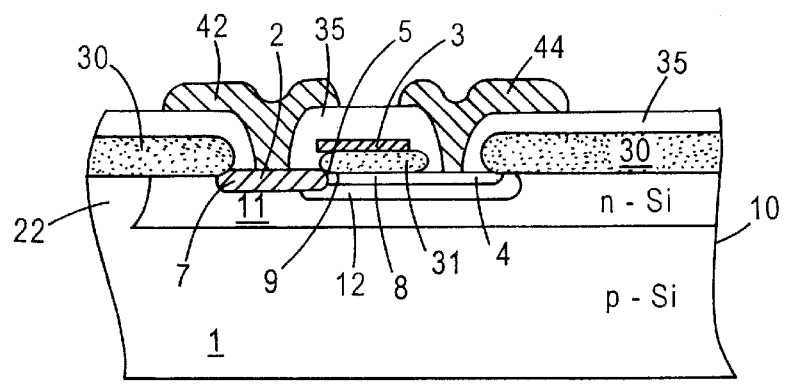
Figure 6C:
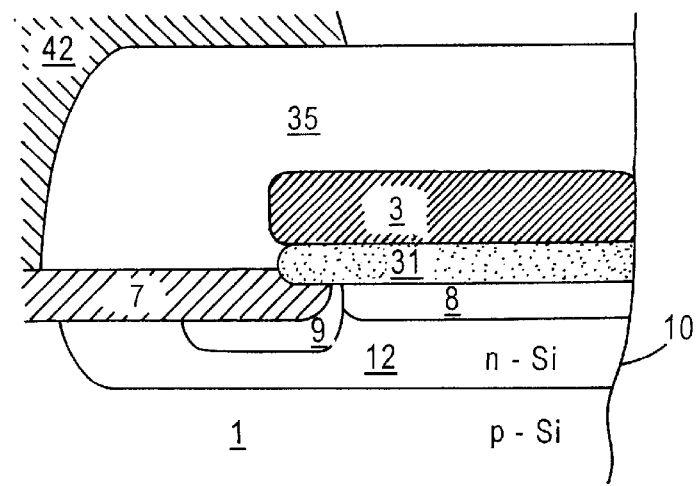

The embodiment in FIGS. 6A to 6C shows a case where a MOS gate Schottky tunnel transistor is formed on a 3 $\mu m$ thick n-well 11 having about $1 \times 10^{16}$ cm$^{-3}$ of n-type impurities density on an n-type silicon (Si) monolithic substrate 1.

In this embodiment, a Schottky barrier diode is formed between the Schottky metal 7 and the n-well 11, and in the ordinary operation of the MOS gate Schottky tunnel transistor, this Schottky barrier diode is reverse biased. A small leak is present, but it is so small that it can be neglected. The n+ layer (first semiconductor layer 8) and the drain 4 are integrally formed. The p+ layer (second semiconductor layer 9) is formed so that the p+ layer is surrounded by the n+ layer. An n-type area 12 formed around the n+ layer and the Schottky metal 7 as the source 2.

Thus, each of the plurality of MOS gate Schottky tunnel transistors formed on the n-well 11 is insulated and separated from each other. FIG. 6A is a general plan view of the embodiment. FIG. 6B is a cross-sectional view taken along the line X—X in FIG. 6A. FIG. 6C is an enlarged view of the cross-sectional view showing the source 2, p+ layer as the second semiconductor layer 9, n+ layer as the first semiconductor layer 8, and the periphery of the above elements.

In this embodiment, the n+ layer can be formed in a shallow position inside a deeply diffused n-well 12 formed around the n+ layer using ion implantation technology. Conversely, the n-well 12 can also be formed with surface density of the n+ layer kept at a high value by being formed as far as the periphery of the n+ layer. Also the p+ layer of the second semiconductor layer 9 surrounded with the n-well 12 or the like can be formed by selectively forming an Al film at only a portion in the gate oxide film 31 of the Schottky metal 7 and being subjected to thermal processing.

Figure 7:
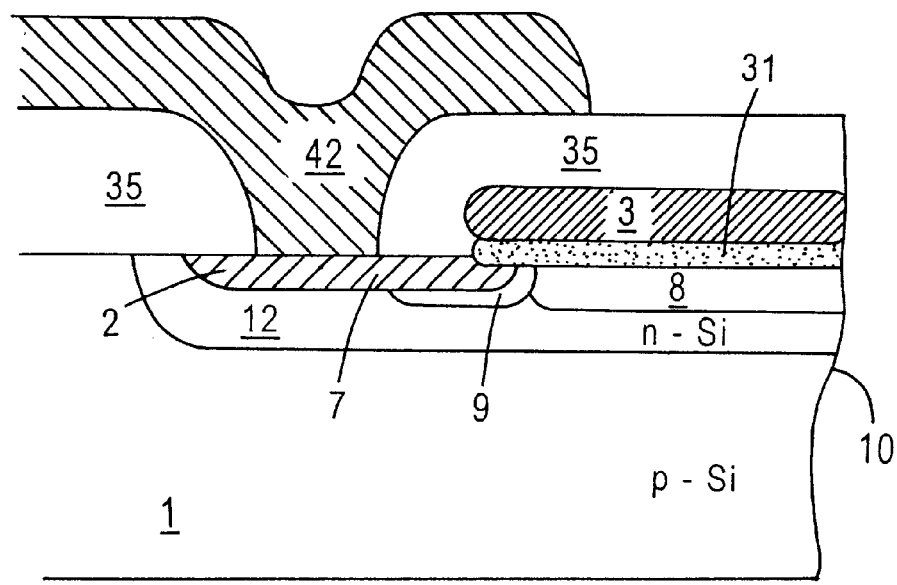
FIG. 7 is a view showing the MOS gate Schottky tunnel transistor according to still another embodiment of the present invention, in which the n-type area 12 in FIG. 6B also surrounds the Schottky metal 7.

The embodiment in FIG. 7 shows an example of a case where the n-well 12 according to the embodiment in FIG. 6 surrounds the entire Schottky metal 7. FIG. 7 is a general view of an enlarged view showing the periphery of the Schottky metal 7. The current flow in the reverse direction of the Schottky barrier diode is generally larger when the diode is formed on the n-type semiconductor with low impurities density than that when the diode is formed on the p-type semiconductor.

Figure 8:
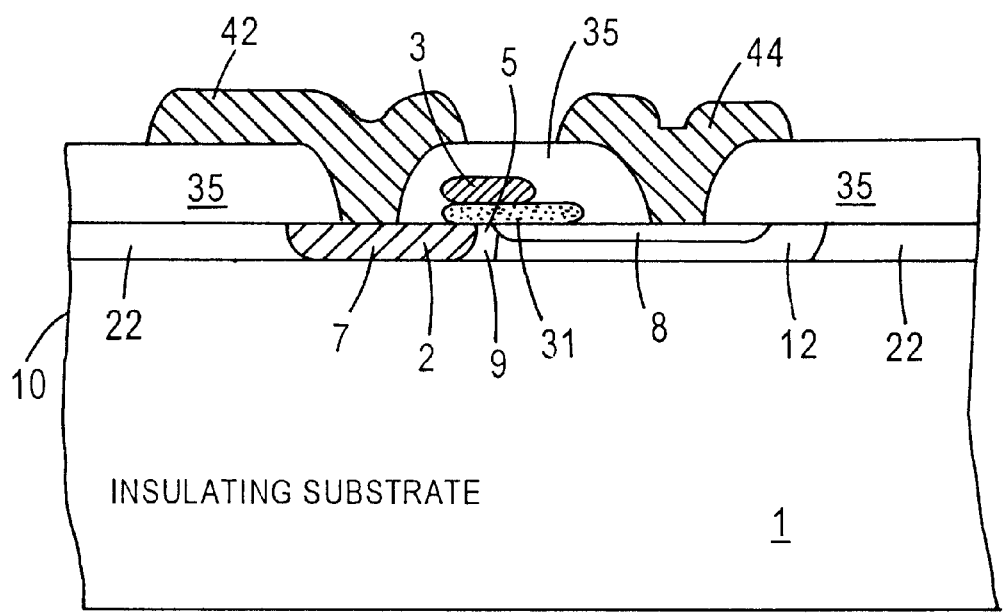
FIG. 8 is a view showing the MOS gate Schottky tunnel transistor according to still another embodiment of the present invention in which a transistor is formed on SOI substrate.

FIG. 8 shows an embodiment comprising a SOI substrate in which a plurality of MOS gate Schottky tunnel transistors can easily be insulated and separated from each other, an n-well 12, and an n+ layer (first semiconductor layer 8). Further, the p+ layer (the second semiconductor layer 9) is surrounded by Schottky metal 7 and p-type semiconductor layers. The p-type semiconductor layers are about 0.1 $\mu$m thick and have a very high resistance so that one unit of MOS gate Schottky tunnel transistor can be insulated and separated from others. Needless to say, as shown in the embodiment in FIG. 7, the Schottky metal 7 in the opposite side of the first semiconductor layer 8 may be surrounded with the n-well 12.

Figure 9:
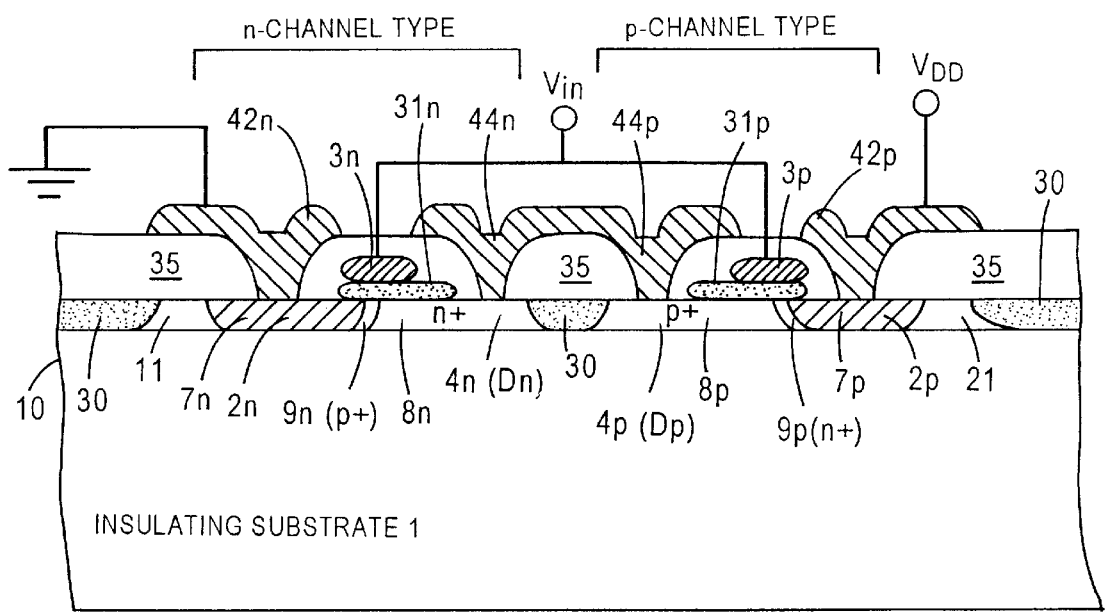
FIG. 9 is a view showing an embodiment in which the MOS gate Schottky tunnel transistor is embodied as a CMOS gate Schottky tunnel transistor in which a transistor is formed on SOI substrate.

The embodiment in FIG. 9 shows a construction of a pair of complementary MOS (CMOS) gate Schottky tunnel transistors when a plurality of CMOS gate Schottky tunnel transistors are formed as an integrated circuit for the SOI substrate 10 similarly to that of the embodiment in FIG. 8. The embodiment of FIG. 9 also shows a the pair of complementary MOS gate Schottky tunnel transistors insulated and separated from other elements with oxide films ($SiO_2$ film).

The MOS gate Schottky tunnel transistor having an n-type first semiconductor layer 8 with a p-type second semiconductor layer 9 as described above in FIG. 9 will be referred to as n-channel type, and an additional letter n will be assigned to each reference numeral like 8n and 9n. On the other hand, the MOS gate Schottky tunnel transistor having a p-type first semiconductor layer 8 with an n-type second semiconductor layer 9 will be referred to as p-channel type, and an additional letter p will be assigned to each reference numeral like 8p and 9p.

The n-type second semiconductor layer 9p in the p-channel type of MOS gate Schottky tunnel transistor in FIG. 9 may be obtained by using tin, gold and antimony in place of an Al film. When, for example, tin and arsenic are used, these metals and Si are alloyed and high-density arsenic is left in a re-crystallized Si, and an extremely thin second semiconductor layer 9n with high density is formed.

The other elements of the transistor such as sources 2n, 2p, drains 4n, 4p, and further gate metals 3n, 3p, passivation film 35, electrodes, and wiring are prepared using the conventional type of integrated circuit technology.

Needless to say, each CMOS gate Schottky tunnel transistor is not insulated and separated for each pair from the others but, for example, a unit or a pair of drains can be made to provide a common drain for a semiconductor without requiring external wiring to integrate a plurality of MOS gate Schottky tunnel transistors or of CMOS gate Schottky tunnel transistors into one unit.

The gate electrode 3 of the MOS gate Schottky tunnel transistors is a silicide. However, ordinary pure metals such as Pt, Al, or Au or a double-layer metal or an alloy of pure metals may be used.

Figure 10:
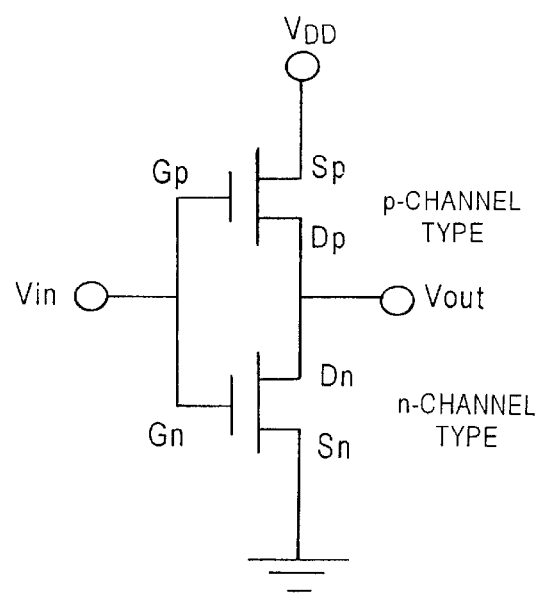
FIG. 10 is a view showing an equivalent circuit comprising the CMOS gate Schottky tunnel transistor shown in FIG. 9.

The embodiment in FIG. 10 is an equivalent circuit showing the pair of CMOS gate Schottky tunnel transistors shown in FIG. 9. This equivalent circuit according to the embodiment shows a case where, in each of the p-channel and n-channel types of MOS gate Schottky tunnel transistors, drains Dp, Dn and gates Gp, Gn are short-circuited using metal electrodes, serially connected to each other, and the p-channel source Sp is connected to an external DC current power supply $V_{DD}$, while the n-channel source Sn is grounded.

Figure 11:
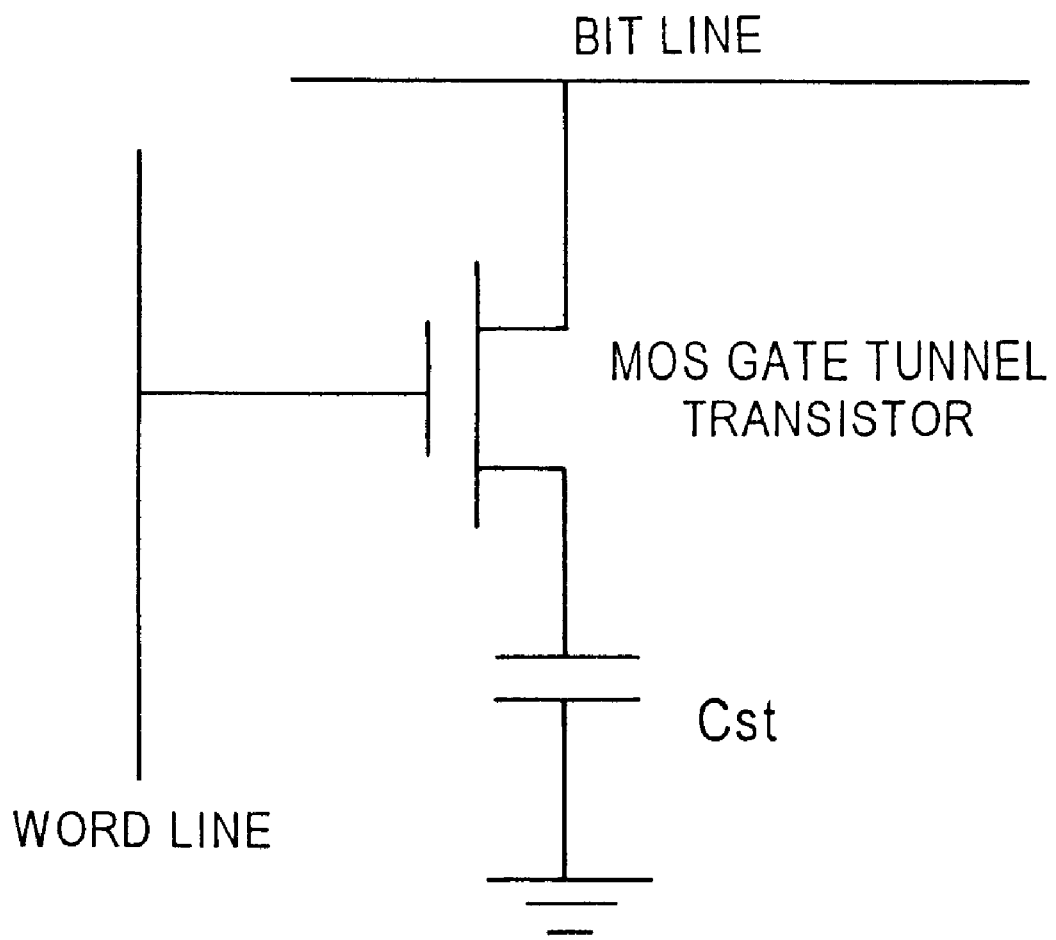
FIG. 11 is a view showing an embodiment of the present invention in which the MOS gate Schottky tunnel transistor according to the present invention is used as a dynamic memory cell.

The embodiment in FIG. 11 shows a case where the MOS gate Schottky tunnel transistor according to the present invention is used as a transistor for transferring dynamic memory cells based on the conventional technology. A bit line is connected to the drain, a word line to the gate, and a capacitor Cst for memory to the source.

It is easy to construct, not only two-dimensionally the MOS gate Schottky tunnel transistor according to the present invention, but also three-dimensionally piled up through an insulation layer not shown in the figure as a high-density integrated circuit. Also, a semiconductor layer for forming a MOS gate Schottky tunnel transistor thereon can be made with a monolithic or a polycrystal semiconductor or an amorphous semiconductor.

In addition, each discrete integrated circuit can be assembled with other types of transistors, inductors and high-volume capacitors as a hybrid construction to perform as one functional device.

Although the same transistor property can be obtained by using an extremely high-density semiconductor in place of the Schottky metal 7, the probability of tunneling is small. Therefore, it is preferable to use the Schottky metal 7 in which the depletion layer does not spread because a tunnel junction becomes narrow.

The MOS gate Schottky tunnel transistor according to the present invention has been described with respect to specific embodiments for a complete and clear disclosure, the appended claims are not be thus limited but are to be construed as embodying all modifications and alternative constructions that may occur to one skilled in the art which fairly fail within the basic teaching herein set forth.

As described above, the MOS gate Schottky tunnel transistor according to the present invention is a transistor obtained by providing a high-density semiconductor layer. This layer is an extremely thin layer with a high-density impurities in a Schottky tunnel junction as a junction of a high-density semiconductor and metal, having a different conduction type from that of the high-density semiconductor layer constituting an original Schottky tunnel junction at least in a MOS interface. By changing the height and width of a barrier of this semiconductor layer according to the field effect due to a voltage loading to a MOS gate, the drain current can be controlled. The transistor obtained is an improvement over the Tunnel Transistor in U.S. Pat. No. 5,552,622 as well as the MOS Gate Schottky Barrier Transistor in Japanese Patent Laid-open Publication No. HEI 9-223795 having been invented by the present applicant, in which a mutual inductance (Gm) can be made larger even when transistors have the same dimensions by enabling concurrent change of a height and a width of a barrier of an inserted semiconductor with extremely low density without changing the width of the Schottky barrier or changing the height of the equivalent Schottky barrier through adjustment of a voltage to be loaded to the gate as that in the previous invention.

The present invention provides a MOS gate Schottky tunnel transistor having a simple construction and an extremely small pseudo single tunnel junction (0.01 $\mu$m or less), and capable of being driven at a low voltage. The MOS gate Schottky tunnel transistors can be formed into an extremely thin semiconductor layer on an insulation layer, so that a three-dimensional integrated circuit can easily be manufactured with the transistors. Also a synthesized current is obtained with a tunnel current and a current due to a flow of carriers moving over an extremely thin barrier, which allows the present invention to be used as a switching transistor and a CMOS transistor or capable of having a microstructure as well as of speedups to obtain high-efficiency transistor and integrated circuit on which high-density integration is possible at high input impedance.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A MOS gate Schottky tunnel transistor based on the construction with a gate metal provided via an insulating thin film on a Schottky junction formed between a Schottky metal as a source and a first semiconductor layer;

wherein the first semiconductor layer with a high density of impurities and having the same conductivity type as that of a drain provided on a surface area of a semiconductor portion of a substrate contacting a MOS interface at least just below the gate metal, said gate Schottky tunnel transistor further comprising an extremely thin second semiconductor layer with a high density of impurities and having a conductivity type different from that of the first semiconductor layer between the first semiconductor layer near the MOS interface at least just below the gate metal and the Schottky metal;

wherein the first semiconductor layer has a density of impurities high enough for the Schottky junction formed by the Schottky metal and first semiconductor layer to become a Schottky tunnel junction when there is no second semiconductor layer and also for a large drain current due to a tunnel current flow even when a voltage is not loaded to the gate metal;

furthermore, the second semiconductor layer with a high density of impurities functions as a barrier against tunnel junction between the Schottky metal and the first semiconductor layer with a height and a thickness allowing only an extremely small drain current as compared to that through the Schottky junction formed by the Schottky metal and the first semiconductor layer when there is no second semiconductor layer to flow therethrough;

and a large drain current flows due to a carrier current flowing through the barrier of the second semiconductor layer because of the tunnel effect as well as to a carrier current flowing over the barrier of the semiconductor layer when height of the barrier of the second semiconductor layer is lowered by applying a voltage to the gate metal.

2. A MOS gate Schottky tunnel transistor according to claim 1; wherein the first semiconductor layer and the drain are the same.

3. A MOS gate Schottky tunnel transistor according to claim 1; wherein at least an area adjacent the drain of a semiconductor portion of the substrate has the same conductivity type as that the drain.

4. A MOS gate Schottky tunnel transistor according to claim 1; wherein at least an area adjacent the drain of a semiconductor portion of the substrate has a different conductivity type from that of the drain.

5. An integrated circuit comprising a MOS gate Schottky tunnel transistor according to claim 3.

6. An integrated circuit comprising a MOS gate Schottky tunnel transistor according to claim 4.

7. An integrated circuit according to claim 5 is formed on an SOI substrate.

8. An integrated circuit according to claim 6 is formed on an SOI substrate.

9. A three-dimensional integrated circuit; wherein the integrated circuit according to claim 5 is formed on one or more of semiconductor layers formed into a three-dimensionally multilayered integrated circuit.

10. A three-dimensional integrated circuit; wherein the integrated circuit according to claim 6 is formed on one or more of semiconductor layers formed into a three-dimensionally multilayered integrated circuit.

11. A hybrid integrated circuit in which an integrated circuit according to claim 5 is combined with other elements such as a resistor element or a capacitor.

12. A hybrid integrated circuit in which an integrated circuit according to claim 6 is combined with other elements such as a resistor element or a capacitor.

13. A hybrid integrated circuit in which an integrated circuit according to claim 7 is combined with other elements such as a resistor element or a capacitor.

14. A hybrid integrated circuit in which an integrated circuit according to claim 8 is combined with other elements such as a resistor element or a capacitor.

15. A hybrid integrated circuit in which an integrated circuit according to claim 9 is combined with other elements such as a resistor element or a capacitor.

16. A hybrid integrated circuit in which an integrated circuit according to claim 10 is combined with other elements such as a resistor element or a capacitor.

* * * * *